(12) United States Patent
Kim et al.

(10) Patent No.: US 9,443,915 B2
(45) Date of Patent: Sep. 13, 2016

(54) FLEXIBLE DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Jeongho Kim, Yongin (KR); Hyunwoo Koo, Yongin (KR); Kihyun Kim, Yongin (KR); Sunho Kim, Yongin (KR); Taewoong Kim, Yongin (KR); Yeongon Mo, Yongin (KR); Hayk Kachatryan, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/698,045

(22) Filed: Apr. 28, 2015

(65) Prior Publication Data

US 2016/0079320 A1    Mar. 17, 2016

(30) Foreign Application Priority Data

Sep. 15, 2014  (KR) .......................... 10-2014-0122047

(51) Int. Cl.
*H01L 33/00* (2010.01)
*H01L 27/32* (2006.01)
*H01L 51/56* (2006.01)
*H01L 51/00* (2006.01)

(52) U.S. Cl.
CPC ......... *H01L 27/3244* (2013.01); *H01L 51/003* (2013.01); *H01L 51/0097* (2013.01); *H01L 51/56* (2013.01); *H01L 2227/323* (2013.01); *H01L 2227/326* (2013.01); *H01L 2251/301* (2013.01); *H01L 2251/5338* (2013.01)

(58) Field of Classification Search
CPC ............... H01L 33/00; H01L 21/6835; H01L 27/3244; H01L 51/5246

USPC .......................................................... 257/88
See application file for complete search history.

(56) References Cited

U.S. PATENT DOCUMENTS

| | | | |
|---|---|---|---|
| 7,456,059 B2 | 11/2008 | Kodaira et al. | |
| 8,168,511 B2 | 5/2012 | Nishiki et al. | |
| 2009/0266471 A1 | 10/2009 | Kim et al. | |
| 2009/0298211 A1* | 12/2009 | Kim | H01L 51/56 438/35 |
| 2010/0283049 A1* | 11/2010 | Sato | H01L 29/78606 257/43 |
| 2011/0059561 A1* | 3/2011 | Liao | H01L 27/1214 438/34 |
| 2011/0248291 A1 | 10/2011 | Jinbo et al. | |
| 2014/0145587 A1* | 5/2014 | Yoon | H01L 21/6835 313/512 |
| 2015/0125972 A1* | 5/2015 | Yoo | H01L 27/1266 438/23 |

FOREIGN PATENT DOCUMENTS

| | | |
|---|---|---|
| JP | 2010-010411 A | 1/2010 |
| JP | 2013-153177 A | 8/2013 |
| KR | 10-2009-0114195 A | 11/2009 |
| KR | 10-2013-0056038 A | 5/2013 |

* cited by examiner

*Primary Examiner* — Phuc Dang
(74) *Attorney, Agent, or Firm* — Lee & Morse, P.C.

(57) ABSTRACT

Provided is a method of manufacturing a flexible display apparatus, the method including forming a sacrificial layer on a support substrate; forming a first material layer having a higher hydrogen concentration than the sacrificial layer on the sacrificial layer; forming a second material layer, preventing hydrogen diffusion from the first material layer to a flexible substrate, on the first material layer; forming the flexible substrate on the second material layer; forming a display layer on the flexible substrate; and irradiating a laser onto the support substrate to delaminate the sacrificial layer from the first material layer.

13 Claims, 4 Drawing Sheets

FLEXIBLE DISPLAY APPARATUS AND METHOD OF MANUFACTURING THE SAME

CROSS-REFERENCE TO RELATED APPLICATION

Korean Patent Application No. 10-2014-0122047, filed on Sep. 15, 2014, in the Korean Intellectual Property Office, and entitled: "Flexible Display Apparatus and Method of Manufacturing the Same," is incorporated by reference herein in its entirety.

BACKGROUND

1. Field

One or more exemplary embodiments relate to flexible display apparatuses and methods of manufacturing the same.

2. Description of the Related Art

Among display apparatuses, organic light-emitting display apparatuses have attracted much attention as the next-generation display apparatuses because of their wide viewing angle, high contrast ratio, and high response speed.

SUMMARY

Embodiments may be realized by providing a method of manufacturing a flexible display apparatus, the method including forming a sacrificial layer on a support substrate; forming a first material layer having a higher hydrogen concentration than the sacrificial layer on the sacrificial layer; forming a second material layer, preventing hydrogen diffusion from the first material layer to a flexible substrate, on the first material layer; forming the flexible substrate on the second material layer; forming a display layer on the flexible substrate; and irradiating a laser onto the support substrate to delaminate the sacrificial layer from the first material layer.

The sacrificial layer may include amorphous silicon (a-Si).

The first material layer may include silicon nitride ($SiN_x$).

The second material layer may include metal oxide.

The metal oxide may include aluminum oxide ($Al_2O_3$).

The method may further include forming a barrier layer after forming the flexible substrate and before forming the display layer.

Embodiments may be realized by providing a method of manufacturing a flexible display apparatus, the method including forming a sacrificial layer on a support substrate; forming a first material layer having a higher hydrogen concentration than the sacrificial layer on the sacrificial layer; forming, on the first material layer, a second material layer preventing hydrogen from diffusing to a side opposite of a side on which the sacrificial layer is located; forming a display layer on the second material layer; and irradiating a laser onto the support substrate to delaminate the sacrificial layer from the first material layer.

The sacrificial layer may include amorphous silicon (a-Si).

The first material layer may include silicon nitride ($SiN_x$).

The second material layer may include metal oxide.

The metal oxide may include aluminum oxide ($Al_2O_3$).

The method may further include forming a barrier layer after forming the second material layer and before forming the display layer.

Embodiments may be realized by providing a flexible display apparatus, including a first material layer including silicon nitride ($SiN_x$); a barrier layer on the first material layer; a second material layer between the first material layer and the barrier layer to prevent hydrogen from diffusing from the first material layer into the barrier layer; and a display layer on the barrier layer.

The flexible display apparatus may further include a flexible substrate between the second material layer and the barrier layer.

The second material layer may include metal oxide.

The metal oxide may include aluminum oxide ($Al_2O_3$).

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, exemplary embodiments will be described in detail with reference to the accompanying drawings. In the following description, like reference numerals denote like elements, and redundant descriptions thereof will be omitted.

It will be understood that although the terms "first", "second", etc. may be used herein to describe various components, these components should not be limited by these terms. These terms are only used to distinguish one component from another. As used herein, the singular forms "a", "an", and "the" are intended to include the plural forms as well, unless the context clearly indicates otherwise.

It will be further understood that the terms "comprise", "include", and "have" used herein specify the presence of stated features or components, but do not preclude the presence or addition of one or more other features or components. It will be understood that when a layer, region, or component is referred to as being "formed on" another layer, region, or component, it may be directly or indirectly formed on the other layer, region, or component. That is, for example, intervening layers, regions, or components may be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Sizes of components in the drawings may be exaggerated for convenience of description. In other words, since sizes and thicknesses of components in the drawings are arbitrarily illustrated for convenience of description, the following embodiments are not limited thereto.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 1:
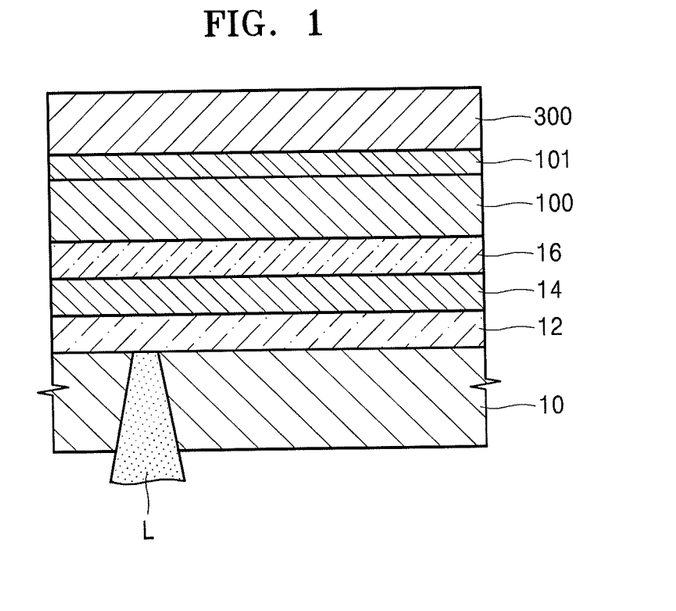
FIGS. 1 and 2 illustrate cross-sectional views schematically of a method of manufacturing a flexible display apparatus according to an exemplary embodiment.
Figure 2:
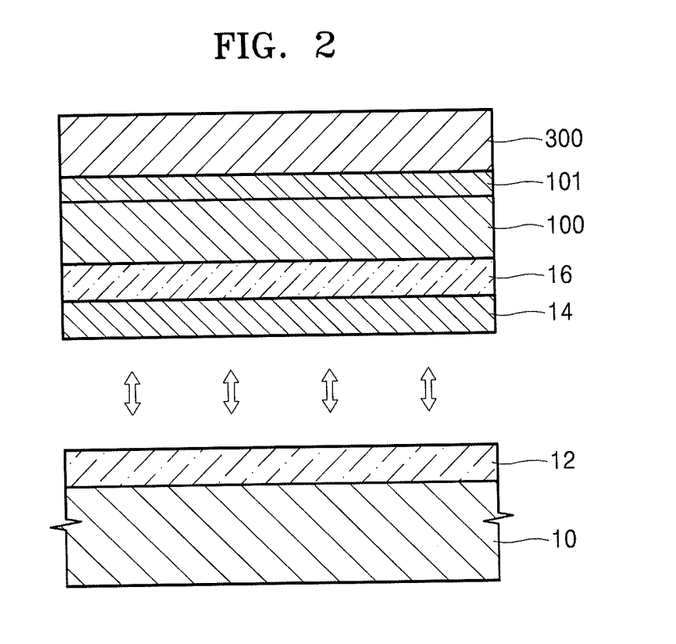

FIGS. 1 and 2 illustrate cross-sectional views schematically of a method of manufacturing a flexible display apparatus according to an exemplary embodiment. Referring to FIGS. 1 and 2, a sacrificial layer 12 may be first formed on a support substrate 10. The support substrate 10 may be formed of various materials having sufficient rigidity, such as glass or metal. Since a flexible substrate 100 is flexible, the support substrate 10 may support the flexible substrate 100 while various layers described below are formed on the flexible substrate 100.

As described above, the sacrificial layer 12 may be first formed on the support substrate 10 before the flexible substrate 100 is formed thereon. The sacrificial layer 12 may be formed of various materials such as amorphous silicon (a-Si), a metallic material, and an organic material such as polyimide. In an exemplary embodiment, the sacrificial layer 12 may be formed of a-Si. The sacrificial layer 12 may facilitate detachment of the flexible substrate 100 from the support substrate 10 and protect the flexible substrate 100 in the process of detaching the flexible substrate 100 from the support substrate 10.

Thereafter, a first material layer 14 having a higher hydrogen concentration than the sacrificial layer 12 may be formed on the sacrificial layer 12. For example, since the first material layer 14 has a higher hydrogen concentration than the sacrificial layer 12, hydrogen may diffuse from the first material layer 14 into the sacrificial layer 12 in the process of detaching the flexible substrate 100 from the support substrate 10. The first material layer 14 may be formed of an inorganic material. For example, the first material layer 14 may be formed of silicon nitride ($SiN_x$) in an exemplary embodiment. In an embodiment, the first material layer 14 may be formed of various other materials having a high hydrogen concentration.

Thereafter, a second material layer 16 may be formed on the first material layer 14, and hydrogen may be prevented from diffusing from the first material layer 14 to the flexible substrate 100. The first material layer 14 may be disposed on one surface of the second material layer 16, the flexible substrate 100 may be disposed on the other surface of the second material layer 16, and the second material layer 16 may prevent hydrogen from diffusing from the first material layer 14 to the flexible substrate 100. The second material layer 16 may function as a hydrogen diffusion blocking layer, and the rate of hydrogen diffusing from the first material layer 14 into the sacrificial layer 12 may be increased.

The second material layer 16 may be formed of metal oxide. For example, the second material layer 16 may be formed of aluminum oxide ($Al_2O_3$) in an exemplary embodiment. In an embodiment, the second material layer 16 may be formed of various other materials that may prevent hydrogen from diffusing from the first material layer 14 to the flexible substrate 100. Although the first material layer 14 and the second material layer 16 are illustrated as having a single-layer structure, they may be variously modified to have, for example, a multi-layer structure.

Thereafter, the flexible substrate 100 may be formed on the second material layer 16. The flexible substrate 100 may be formed of various flexible materials such as flexible metallic materials or plastic materials such as polyethylen terephthalate (PET), polyethylen naphthalate (PEN), and polyimide. In some cases, the flexible substrate 100 may be formed of metal foil such as steel use stainless (SUS).

Thereafter, a barrier layer 101 may be formed on the flexible substrate 100. The barrier layer 101 may prevent impurities from flowing into an organic light-emitting device 200 (see FIG. 5) or a thin film transistor TFT (see FIG. 5) included in a display layer 300 formed on the flexible substrate 100. The barrier layer 101 may be formed of a material such as silicon oxide or silicon nitride to have a single-layer structure or a multi-layer structure.

Thereafter, the display layer 300 may be formed on the flexible substrate 100. The display layer 300 may include the thin film transistor TFT, a capacitor CAP, and the organic light-emitting device 200 that is electrically connected to the thin film transistor TFT. A detailed structure of the display layer 300 will be described later with reference to FIG. 5.

After the display layer 300 is formed on the flexible substrate 100, a laser may be irradiated onto the support substrate 10 to separate the flexible substrate 100 from the support substrate 10. When the laser is irradiated onto the support substrate 10, hydrogen may be generated from the sacrificial layer 12 formed on the support substrate 10, the junction energy between the sacrificial layer 12 and the first material layer 14 may be reduced, and the first material layer 14 may be delaminated from the sacrificial layer 12. To detach the flexible substrate 100 from the support substrate 10, the hydrogen concentration of the sacrificial layer 12 has to be maintained so that hydrogen may be generated from the sacrificial layer 12. The hydrogen concentration of the sacrificial layer 12 may be rapidly reduced in a dehydrogenation process and a heat treatment process during formation of the thin film transistor TFT in the process of forming the display layer 300 on the barrier layer 101 formed on the flexible substrate 100 as described above.

In the method of manufacturing a flexible display apparatus according to an exemplary embodiment, to maintain the hydrogen concentration of the sacrificial layer 12 even in a high-temperature heat treatment process, the first material layer 14 having a high hydrogen concentration may be formed on the sacrificial layer 12 so that hydrogen may diffuse from the first material layer 14 into the sacrificial layer 12 in the process of forming the thin film transistor TFT of the display layer 300.

As described above, to increase the rate of hydrogen diffusing from the first material layer 14 into the sacrificial layer 12, the second material layer 16 that may function as a hydrogen diffusion blocking layer may be formed between the first material layer 14 and the flexible substrate 100, and hydrogen diffusing from the first material layer 14 may diffuse into the sacrificial layer 12 without diffusing into the flexible substrate 100.

Referring to FIG. 2, the flexible substrate 100 may be detached from the support substrate 10, for example, due to delamination of the first material layer 14 from the sacrificial layer 12 caused by irradiating the laser onto the support substrate 10 as described above. A bottom portion of the flexible substrate 100 may be protected by forming the first material layer 14 and the second material layer 16 under the flexible substrate 100.

Figure 3:
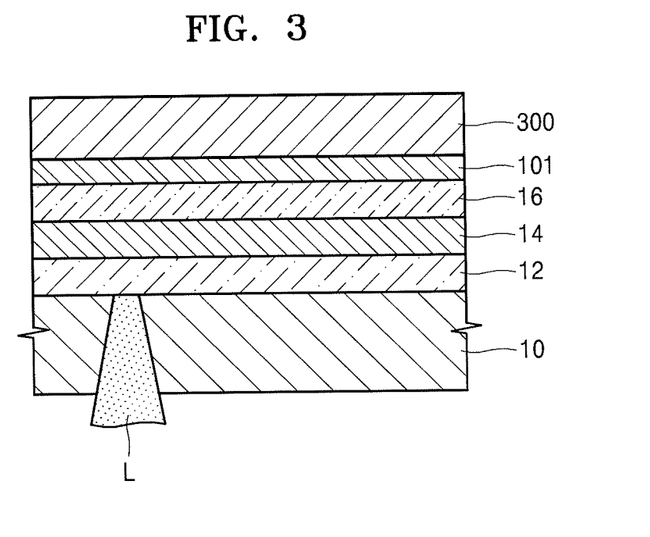
FIGS. 3 and 4 illustrate cross-sectional views schematically of a method of manufacturing a flexible display apparatus according to another exemplary embodiment.
Figure 4:
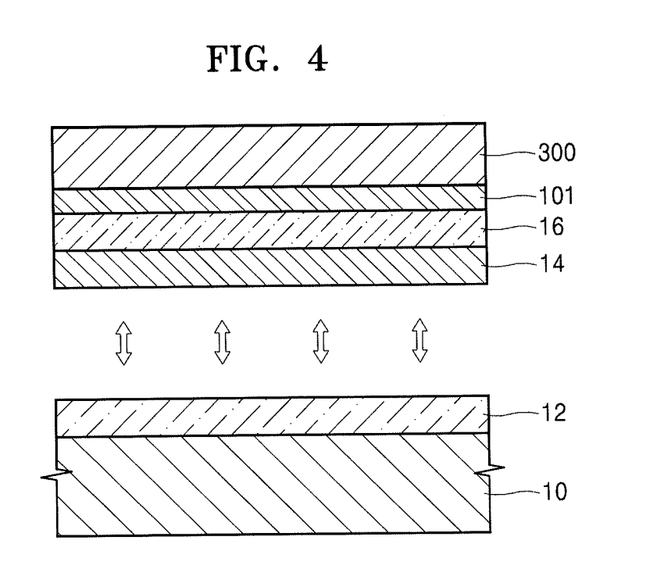

FIGS. 3 and 4 illustrate cross-sectional views schematically of a method of manufacturing a flexible display apparatus according to another exemplary embodiment. FIGS. 3 and 4 illustrate a method of manufacturing a flexible display apparatus by detaching a display layer 300 formed on a barrier layer 101 from a support substrate 10, without using the flexible substrate 100.

Referring to FIGS. 3 and 4, a sacrificial layer 12 may be first formed on a support substrate 10. The support substrate 10 may be formed of various materials having sufficient rigidity, such as glass or metal. Since a flexible display is flexible, the support substrate 10 may support the flexible display while various layers of the flexible display described below are formed.

As described above, the sacrificial layer 12 may be first formed on the support substrate 10 before a display layer 300 may be formed thereon. The sacrificial layer 12 may be formed of various materials such as amorphous silicon (a-Si), a metallic material, and an organic material such as polyimide. In an exemplary embodiment, the sacrificial layer 12 may be formed of a-Si. The sacrificial layer 12 may facilitate detachment of the display layer 300 from the support substrate 10 and protect the display layer 300 in the process of detaching the display layer 300 from the support substrate 10.

Thereafter, a first material layer 14 having a higher hydrogen concentration than the sacrificial layer 12 may be formed on the sacrificial layer 12. For example, since the first material layer 14 has a higher hydrogen concentration than the sacrificial layer 12, hydrogen may diffuse from the first material layer 14 into the sacrificial layer 12 in the process of detaching the display layer 300 from the support substrate 10. The first material layer 14 may be formed of an inorganic material. For example, the first material layer 14 may be formed of silicon nitride ($SiN_x$) in an exemplary embodiment. In an embodiment, the first material layer 14 may be formed of various other materials having a high hydrogen concentration.

Thereafter, a second material layer 16 may be formed on the first material layer 14, and hydrogen may be prevented from diffusing from the first material layer 14 into the display layer 300. The first material layer 14 may be disposed on one surface of the second material layer 16, a barrier layer 101 may be disposed on the other surface of the second material layer 16, and the second material layer 16 may prevent hydrogen from diffusing from the first material layer 14 into the barrier layer 101. The second material layer 16 may function as a hydrogen diffusion blocking layer, and the rate of hydrogen diffusing from the first material layer 14 into the sacrificial layer 12 may be increased.

The second material layer 16 may be formed of metal oxide. For example, the second material layer 16 may be formed of aluminum oxide ($Al_2O_3$) in an exemplary embodiment. In an exemplary embodiment, the second material layer 16 may be formed of various other materials that may prevent hydrogen from diffusing from the first material layer 14 into the barrier layer 101. Although the first material layer 14 and the second material layer 16 are illustrated as having a single-layer structure, they may be variously modified to have, for example, a multi-layer structure.

Thereafter, the barrier layer 101 may be formed on the second material layer 16. The barrier layer 101 may prevent impurities from flowing into an organic light-emitting device 200 (see FIG. 5) or a thin film transistor TFT (see FIG. 5) included in the display layer 300 formed on the barrier layer 101. The barrier layer 101 may be formed of a material such as silicon oxide or silicon nitride to have a single-layer structure or a multi-layer structure.

Thereafter, the display layer 300 may be formed on the barrier layer 101. The display layer 300 may include the thin film transistor TFT, a capacitor CAP, and the organic light-emitting device 200 that is electrically connected to the thin film transistor TFT. A detailed structure of the display layer 300 will be described later with reference to FIG. 5.

After the display layer 300 is formed on the barrier layer 101, a laser may be irradiated onto the support substrate 10 to separate the display layer 300 from the support substrate 10. When the laser is irradiated onto the support substrate 10, hydrogen may be generated from the sacrificial layer 12 formed on the support substrate 10, the junction energy between the sacrificial layer 12 and the first material layer 14 may be reduced, and the first material layer 14 may be delaminated from the sacrificial layer 12. To detach the display layer 300 from the support substrate 10, the hydrogen concentration of the sacrificial layer 12 has to be maintained so that hydrogen may be generated from the sacrificial layer 12. The hydrogen concentration of the sacrificial layer 12 may be rapidly reduced in a dehydrogenation process and a heat treatment process during formation of the thin film transistor TFT in the process of forming the display layer 300 on the barrier layer 101 as described above.

In the method of manufacturing a flexible display apparatus according to an exemplary embodiment, to maintain the hydrogen concentration of the sacrificial layer 12 even in a high-temperature heat treatment process, the first material layer 14 having a high hydrogen concentration may be formed on the sacrificial layer 12, and hydrogen may diffuse from the first material layer 14 into the sacrificial layer 12 in the process of forming the thin film transistor TFT of the display layer 300.

As described above, to increase the rate of hydrogen diffusing from the first material layer 14 into the sacrificial layer 12, the second material layer 16 that may function as a hydrogen diffusion blocking layer may be formed between the first material layer 14 and the barrier layer 101, and hydrogen diffusing from the first material layer 14 may diffuse into the sacrificial layer 12 without diffusing into the barrier layer 101.

Referring to FIG. 4, the display layer 300 may be detached from the support substrate 10, for example, due to delamination of the first material layer 14 from the sacrificial layer 12 caused by irradiating the laser onto the support substrate 10 as described above. A bottom portion of the flexible display apparatus may be protected by forming the first material layer 14, the second material layer 16, and the barrier layer 101 under the display layer 300. According to the method of manufacturing a flexible display apparatus according to another exemplary embodiment, since the lower barrier characteristics may be improved by the first material layer 14, the second material layer 16, and the barrier layer 101, the display layer 300 may be separated from the support substrate 10 even without using the flexible substrate 100.

Methods of manufacturing a flexible display apparatus have been mainly described. Also provided are flexible display apparatuses manufactured by the methods of manufacturing a flexible display apparatus.

Figure 5:
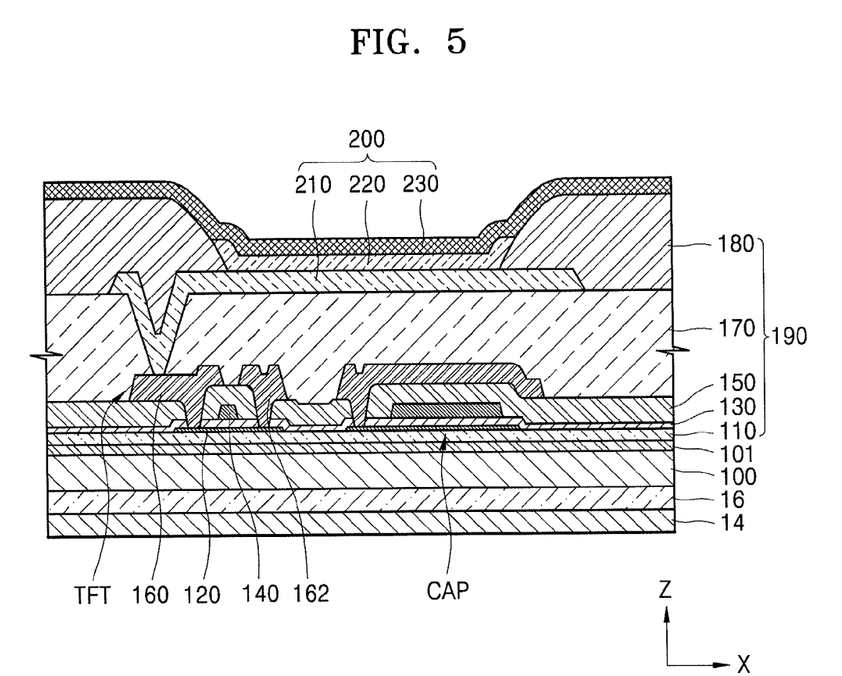
FIG. 5 illustrates a cross-sectional view schematically of a flexible display apparatus manufactured by the manufacturing method of FIGS. 1 and 2.

FIG. 5 illustrates a cross-sectional view schematically of a flexible display apparatus manufactured by the manufacturing method of FIGS. 1 and 2. Referring to FIG. 5, a flexible display apparatus according to another exemplary embodiment may include a flexible substrate 100, a barrier layer 101, a thin film transistor layer 190 and an organic light-emitting device 200 disposed on one surface of the flexible substrate 100, and a first material layer 14 and a second material layer 16 disposed on the other surface of the flexible substrate 100. The above-described display layer 300 may include the thin film transistor layer 190 and the organic light-emitting device 200.

The flexible substrate 100 may be formed of various flexible materials such as flexible metallic materials or plastic materials such as polyethylen terephthalate (PET), polyethylen naphthalate (PEN), and polyimide.

The barrier layer 101 may be disposed on a top surface of the flexible substrate 100. The barrier layer 101 may prevent impurities from flowing into the organic light-emitting device 200 or a thin film transistor TFT included in the display layer 300 formed on the flexible substrate 100. The barrier layer 101 may be formed of a material such as silicon oxide or silicon nitride to have a single-layer structure or a multi-layer structure.

The display layer 300 may be disposed on the barrier layer 101, and the display layer 300 may include the thin film transistor TFT, a capacitor CAP, and the organic light-emitting device 200 that is electrically connected to the thin film transistor TFT. The thin film transistor TFT may include a semiconductor layer 120 including amorphous silicon, polycrystalline silicon, or an organic semiconductor material, a gate electrode 140, a source electrode 160, and a drain electrode 162. A structure of the thin film transistor TFT will be described below in detail.

First, to planarize the surface of the flexible substrate 100 or prevent impurities from penetrating into the semiconductor layer 120 of the thin film transistor TFT, a buffer layer 110 formed of silicon oxide or silicon nitride may be disposed on the flexible substrate 100, and the semiconductor layer 120 may be disposed on the buffer layer 110.

The gate electrode 140 may be disposed on the semiconductor layer 120, and the source electrode 160 and the drain electrode 162 may be electrically connected according to a signal applied to the gate electrode 140. In consideration of, for example, adhesion to an adjacent layer, surface evenness of a stacked layer, and processability, the gate electrode 140 may be formed to have a single-layer structure or a multi-layer structure including, for example, one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu).

For insulation between the semiconductor layer 120 and the gate electrode 140, a gate insulating layer 130 formed of silicon oxide and/or silicon nitride may be disposed between the semiconductor layer 120 and the gate electrode 140.

An interlayer insulating layer 150 may be disposed on the gate electrode 140. The interlayer insulating layer 150 may be formed to have a single-layer structure or a multi-layer structure including a material such as silicon oxide or silicon nitride.

The source electrode 160 and the drain electrode 162 may be disposed on the interlayer insulating layer 150. The source electrode 160 and the drain electrode 162 may be electrically connected to the semiconductor layer 120 through contact holes formed in the interlayer insulating layer 150 and the gate insulating layer 130. In consideration of, for example, conductivity, the source electrode 160 and the drain electrode 162 may be formed to have a single-layer structure or a multilayer structure including one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu).

Although not illustrated in the drawings, a passivation layer (not illustrated) may be disposed to cover the thin film transistor TFT and may protect the thin film transistor TFT. The passivation layer may be formed of, for example, an inorganic material such as silicon oxide, silicon nitride, or silicon oxynitride.

A first insulating layer 170 may be disposed on the flexible substrate 100. The first insulating layer 170 may be a planarization layer or a passivation layer. When the organic light-emitting device 200 is disposed on the thin film transistor TFT, the first insulating layer 170 may planarize the top surface of the thin film transistor TFT and protect the thin film transistor TFT and various devices. The first insulating layer 170 may be formed of for example, an acryl-based organic material or benzocyclobutene (BCB). As illustrated in FIG. 5, the buffer layer 110, the gate insulating layer 130, the interlayer insulating layer 150, and the first insulating layer 170 may be formed over the flexible substrate 100.

A second insulating layer 180 may be disposed on the thin film transistor TFT. The second insulating layer 180 may be a pixel definition layer. The second insulating layer 180 may be disposed on the first insulating layer 170 and may have an opening. The second insulating layer 180 may define a pixel region on the flexible substrate 100.

The second insulating layer 180 may be, for example, an organic insulating layer. The organic insulating layer may include an acryl-based polymer such as polymethylmethacrylate (PMMA), polystyrene (PS), a polymer derivative having a phenol group, an imide-based polymer, an arylether-based polymer, an amide-based polymer, a fluorine-based polymer, a p-xylene-based polymer, a vinylalcohol-based polymer, or a mixture thereof.

The organic light-emitting device 200 may be disposed on the second insulating layer 180. The organic light-emitting device 200 may include a pixel electrode 210, an intermediate layer 220 including an emission layer EML, and an opposite electrode 230.

The pixel electrode 210 may be formed of a transparent (or semitransparent) electrode or a reflective electrode. When the pixel electrode 210 is formed of a transparent (or semitransparent) electrode, the pixel electrode 210 may be formed of, for example, indium tin oxide (ITO), indium zinc oxide (IZO), zinc oxide (ZnO), indium oxide ($In_2O_3$), indium zinc oxide (IGO), or aluminum zinc oxide (AZO). When the pixel electrode 210 is formed of a reflective electrode, the pixel electrode 210 may include a reflective layer formed of Ag, Mg, Al, Pt, Pd, Au, Ni, Nd, Ir, Cr, or a mixture thereof and a layer formed of ITO, IZO, ZnO, $In_2O_3$, IGO, or AZO. In an embodiment, pixel electrode 210 may be formed of various other materials and may be variously modified to have, for example, a single-layer structure or a multi-layer structure.

The intermediate layer 220 may be disposed in the pixel region defined by the second insulating layer 180. In an embodiment, the intermediate layer 220 may include an emission layer EML emitting light in response to an electrical signal and may further include a stack structure of a hole transport layer (HTL) and a hole injection layer (HIL) disposed between the emission layer EML and the pixel electrode 210, and an electron injection layer EIL and an electron transport layer ETL disposed between the emission layer EML and the opposite electrode 230.

The opposite electrode 230, which may be opposite the pixel electrode 210 and cover the intermediate layer 220 including the emission layer EML, may be disposed over the flexible substrate 100. The opposite electrode 230 may be formed of a transparent (or semitransparent) electrode or a reflective electrode.

In an embodiment, the opposite electrode 230 may be formed of a transparent (or semitransparent) electrode, and the opposite electrode 230 may include a layer formed of metal having a low work function, such as Li, Ca, LiF/Ca, LiF/Al, Al, Ag, Mg, or a mixture thereof, and a transparent (or semitransparent) conductive layer formed of ITO, IZO, ZnO, or $In_2O_3$. In an embodiment, the opposite electrode 230 may be formed of a reflective electrode, and the opposite electrode 230 may include a layer formed of Li, Ca, LiF/Ca, LiF/Al, Al, Ag, Mg, or a mixture thereof.

The second material layer 16 and the first material layer 14 may be sequentially disposed under the flexible substrate 100. The second material layer 16 may be disposed on the first material layer 14, and the flexible substrate 100 may be disposed on the second material layer 16. The first material layer 14 may be a hydrogen-rich layer having a high hydrogen concentration. As described above, the first material layer 14 may facilitate delamination between the sacrificial layer 12 and the flexible substrate 100 in the process of detaching the flexible substrate 100 from the support substrate 10 during the process of manufacturing the flexible display apparatus. The first material layer 14 may supply hydrogen into the sacrificial layer 12 and may prevent the hydrogen concentration of the sacrificial layer 12 from being reduced, for example, due to a high-temperature heat treatment process in the process of forming the thin film transistor layer 190 on the flexible substrate. The first material layer 14 may be formed of an inorganic material. In the present exemplary embodiment, the first material layer 14 may be formed of silicon nitride ($SiN_x$). In an embodiment, the first material layer 14 may be formed of various other materials having a high hydrogen concentration.

The second material layer 16 may be disposed on the first material layer 14 and may prevent hydrogen from diffusing from the first material layer 14 into the flexible substrate 100. The first material layer 14 may be disposed on one surface of the second material layer 16, the flexible substrate 100 may be disposed on the other surface of the second material layer 16, and the second material layer 16 may prevent hydrogen from diffusing from the first material layer 14 into the flexible substrate 100. The second material layer 16 may function as a hydrogen diffusion blocking layer, and the rate of hydrogen diffusing from the first material layer 14 into the sacrificial layer 12 may be increased.

The second material layer 16 may be formed of metal oxide. For example, the second material layer 16 may be formed of aluminum oxide ($Al_2O_3$) in an exemplary embodiment. In an embodiment, the second material layer 16 may be formed of various other materials that may prevent hydrogen from diffusing from the first material layer 14 to the flexible substrate 100. Although the first material layer 14 and the second material layer 16 are illustrated as having a single-layer structure, they may be variously modified to have, for example, a multi-layer structure.

In the flexible display apparatus according to another exemplary embodiment, to maintain the hydrogen concentration of the sacrificial layer 12 even in a high-temperature heat treatment process, the first material layer 14 having a high hydrogen concentration may be formed on the sacrificial layer 12, and hydrogen may diffuse from the first material layer 14 into the sacrificial layer 12 in the process of forming the thin film transistor layer 190. To increase the rate of hydrogen diffusing from the first material layer 14 into the sacrificial layer 12, the second material layer 16 that may function as a hydrogen diffusion blocking layer may be formed between the first material layer 14 and the barrier layer 101, and hydrogen diffusing from the first material layer 14 may diffuse into the sacrificial layer 12 without diffusing into the barrier layer 101.

Figure 6:
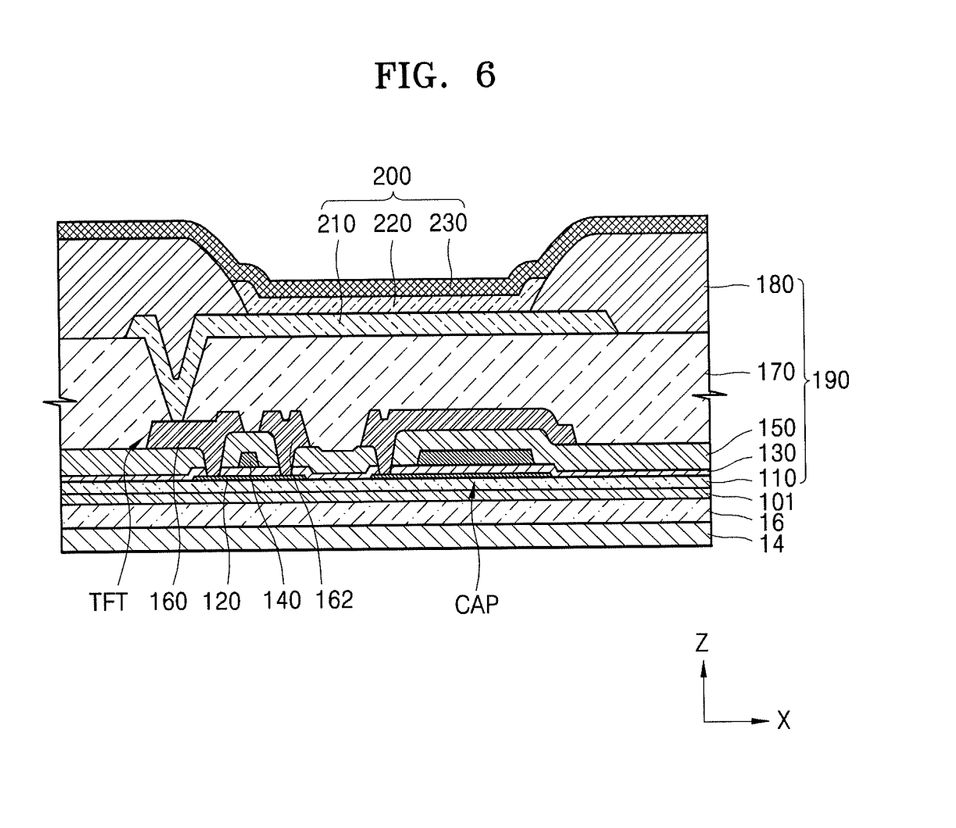
FIG. 6 illustrates a cross-sectional view schematically of a flexible display apparatus manufactured by the manufacturing method of FIGS. 3 and 4.

A bottom portion of the flexible display apparatus may be protected by forming the first material layer 14, the second material layer 16, and the barrier layer 101 under the display layer 300. As illustrated in FIG. 6, in a flexible display apparatus according to another exemplary embodiment, since the lower barrier characteristics may be improved by the first material layer 14, the second material layer 16, and the barrier layer 101, the display layer 300 may be separated from the support substrate 10 even without using the flexible substrate 100.

By way of summation and review, in an organic light-emitting display apparatus, thin film transistors and organic light-emitting devices may be formed on a substrate, and the organic light-emitting devices may emit light for the operation of the organic light-emitting display apparatus. The organic light-emitting display apparatus may be used as a display unit in a small-sized product such as a portable phone and as a display unit in a large-sized product such as a television.

A flexible substrate, which, unlike a glass substrate, is formed of a flexible material such as plastic, may be used to obtain a flexible display apparatus. However, due to its flexibility, a flexible substrate may not be easy to handle in a manufacturing process. Thus, a flexible substrate may be formed on a support substrate having sufficient rigidity and then the flexible substrate may be separated from the support substrate after several processes. However, in the case of a flexible display apparatus and a method of manufacturing the same, the function of a sacrificial layer, which may be disposed between a support substrate and a flexible substrate to facilitate delamination of the flexible substrate from the support substrate, may degrade in the process of forming on the flexible substrate a display layer including thin film transistors.

As described above, according to the one or more of the above exemplary embodiments, the flexible display apparatuses and the methods of manufacturing the same, which facilitate detachment of the flexible substrate and provide improved barrier characteristics under the flexible substrate, may be implemented.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a flexible display apparatus, the method comprising:
    forming a sacrificial layer on a support substrate;
    forming a first material layer having a higher hydrogen concentration than the sacrificial layer on the sacrificial layer;
    diffusing hydrogen from the first material layer into the sacrificial layer;
    forming a second material layer, preventing hydrogen diffusion from the first material layer to a flexible substrate, and increasing a rate of hydrogen diffusing from the first material layer into the sacrificial layer, on the first material layer, the second material layer including a metal oxide;
    forming the flexible substrate on the second material layer;
    forming a display layer on the flexible substrate; and
    irradiating a laser onto the support substrate to delaminate the sacrificial layer from the first material layer.

2. The method as claimed in claim 1, wherein the sacrificial layer includes amorphous silicon (a-Si).

3. The method as claimed in claim 1, wherein the first material layer includes silicon nitride ($SiN_x$).

4. The method as claimed in claim 1, wherein the metal oxide includes $Al_2O_3$.

5. The method as claimed in claim 1, further comprising forming a barrier layer after forming the flexible substrate and before forming the display layer.

6. A method of manufacturing a flexible display apparatus, the method comprising:
    forming a sacrificial layer on a support substrate;
    forming a first material layer having a higher hydrogen concentration than the sacrificial layer on the sacrificial layer;
    diffusing hydrogen from the first material layer into the sacrificial layer;
    forming, on the first material layer, a second material layer preventing hydrogen from diffusing to a side opposite of a side on which the sacrificial layer is located, and increasing a rate of hydrogen diffusing from the first material layer into the sacrificial layer, the second material layer including a metal oxide;
    forming a display layer on the second material layer; and
    irradiating a laser onto the support substrate to delaminate the sacrificial layer from the first material layer.

7. The method as claimed in claim 6, wherein the sacrificial layer includes amorphous silicon (a-Si).

8. The method as claimed in claim 6, wherein the first material layer includes silicon nitride ($SiN_x$).

9. The method as claimed in claim 6, wherein the metal oxide includes $Al_2O_3$.

10. The method as claimed in claim 6, further comprising forming a barrier layer after forming the second material layer and before forming the display layer.

11. A flexible display apparatus, comprising:
    a first material layer including silicon nitride ($SiN_x$);
    a barrier layer on the first material layer;
    a second material layer between the first material layer and the barrier layer to prevent hydrogen from diffusing from the first material layer into the barrier layer, the second material layer including a metal oxide; and
    a display layer on the barrier layer.

12. The flexible display apparatus as claimed in claim 11, further comprising a flexible substrate between the second material layer and the barrier layer.

13. The flexible display apparatus as claimed in claim 11, wherein the metal oxide includes $Al_2O_3$.

* * * * *